United States Patent [19]

Woodburn

[11] 4,079,265

[45] Mar. 14, 1978

[54] APPARATUS FOR PRODUCING HIGH VOLTAGE PULSES BY CAPACITOR DISCHARGE

[75] Inventor: David Kerr Woodburn, Caterham, England

[73] Assignee: Wego Condenser Company Limited, Middlesex, England

[21] Appl. No.: 667,729

[22] Filed: Mar. 17, 1976

[51] Int. Cl.² .............................................. H03K 3/64
[52] U.S. Cl. ..................................... 307/108; 363/61; 250/402; 320/1
[58] Field of Search ............... 307/260, 246, 106, 107, 307/108, 109, 110, 117; 328/67; 315/241 R, 241 P, 241 S; 321/2, 43, 44, 45 R, 45 C; 320/1; 250/402-422; 363/59, 60, 61

[56] References Cited

U.S. PATENT DOCUMENTS

2,534,758  12/1950  Titterton ............................. 307/110
3,387,201  6/1968  Greenberg et al. ..................... 321/2

*Primary Examiner*—Robert K. Schaefer
*Assistant Examiner*—Morris Ginsburg
*Attorney, Agent, or Firm*—Ostrolenk, Faber, Gerb & Soffen

[57] ABSTRACT

For energizing an X-ray tube in a diagnostic X-ray unit, a group of capacitors are each charged up to a voltage lower than that required by the X-ray tube, and then the capacitors are discharged one after another through the primary winding of a voltage step-up transformer in such a manner as to produce AC in the secondary winding which is then rectified and applied to the X-ray tube.

18 Claims, 7 Drawing Figures

APPARATUS FOR PRODUCING HIGH VOLTAGE PULSES BY CAPACITOR DISCHARGE

BACKGROUND OF THE INVENTION

1. Field of the invention

This invention relates to apparatus for producing high voltage pulses by capacitor discharge. One application of the invention is to provide apparatus for producing high voltage pulses by capacitor discharge for driving an X-ray tube in a transportable diagnostic X-ray unit.

2. Description of the prior art

Figure 1:
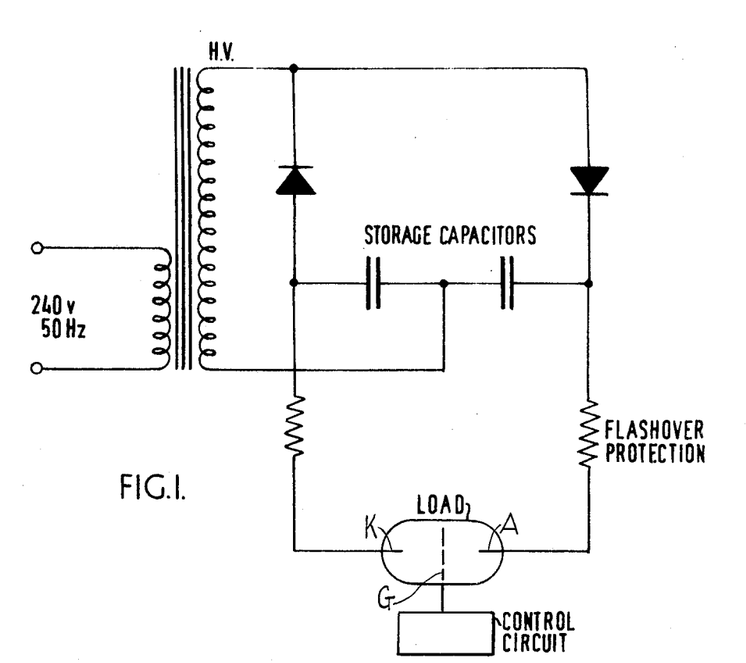
FIG. 1 is a schematic diagram showing the conventional technique for supplying power to an X-ray tube using storage capacitors.

Referring to the accompanying drawings, FIG. 1 is a circuit diagram of an X-ray tube "LOAD" connected to a conventional apparatus (not in accordance with the invention) for producing high voltage pulses by capacitor discharge, for driving the X-ray tube. More particularly, a very high-voltage transformer H.V. has a primary winding supplied with 240 volts AC at 50Hz, and has a very high-voltage secondary winding connected as shown via two diodes to two storage capacitors each of (say) 2μF capacitance, to charge each capacitor slowly up to about 65kV. Since the two capacitors are in series and are charged by the circuit shown with opposite polarities, the total voltage across them is about 130kV. The capacitance, 2μF, of each capacitor is such that the total energy then stored by the two capacitors is about 8 kilojoules. The capacitors are connected in series through two flashover protection resistances to the anode $a$ and cathode $k$ of the X-ray tube, which has a control grid connected to a control circuit for controlling the timing and duration of X-ray emission.

Unfortunately, because the control grid may not be 100% effective and because the 130kV is continuously across the anode and cathode, there may continuously occur some X-ray leakage from the tube, which is dangerous.

Furthermore, the desired quality of X-ray emission is such that the only useful pulse energy that is produced is that from a fall in voltage in the range from about 130kV to about 80kV or higher, so that only a small proportion of the stored energy is utilised. Hence the capacitors have to be much larger and heavier than they would if more of the energy could be utilised, which is disadvantageous in a transportable X-ray unit.

Furthermore, 8 kilojoules energy stored at 130kV in a transportable X-ray unit is potentially extremely dangerous, even fatally so, because of the possibility of a breakdown of electrical insulation.

SUMMARY OF THE INVENTION

It is an object of the invention to provide an apparatus for producing high voltage pulses by capacitor discharge in which energy can be stored at a lower voltage and in which more of the stored energy can be utilised.

As seen from one aspect of the invention there is provided an apparatus for generating high voltage pulses by capacitor discharge, comprising a plurality of capacitors, means for charging up each capacitor, a voltage step-up transformer having at least one primary winding, a core and at least one secondary winding, switching means selectively operable to at least partly discharge the capacitors sequentially through said at least one primary winding in such a manner as to induce an alternating magnetic field in the core and a high alternating voltage in the or each secondary winding, and rectifier means to rectify the high alternating voltage from the secondary winding.

Preferably the apparatus comprises filter means to smooth the output from the apparatus. Preferably the filter means comprises at least one smoothing capacitor.

Said plurality of capacitors may be arranged with a common connection to one electrode of each of said plurality of capacitors, with a positive charging connection to another electrode of each of some of said plurality of capacitors and with a negative charging connection to another electrode of the remainder of said plurality of capacitors, from the charging means.

Preferably the apparatus includes selectively operable means to control the number of capacitors discharged and hence to control the total energy of the output.

Preferably the voltage step-up ratio of the voltage step-up transformer is selectively variable by variation of the number of primary winding turns through which each of said plurality of capacitors is discharged.

Preferably a further capacitor is arranged to impress a relatively low slowly decaying voltage across the or one primary winding of the voltage step-up transformer to produce an initial flux in the core opposite in polarity to that to be produced by the discharge of the first one of said plurality of capacitors in the sequence.

Preferably the first capacitor to discharge in the sequence of said plurality of capacitors has a different capacitance to that of each of at least a last group of said capacitors to discharge.

Preferably the capacitance of said first capacitor is more than that of each of said last group of capacitors.

Preferably the first capacitor to discharge in the sequence of said plurality of capacitors is arranged to discharge into a different number of primary winding turns than each of at least a last group of said capacitors to discharge.

Preferably the said different number of primary winding turns is a greater number.

Preferably each of said plurality of capacitors is discharged by means of a respective one of a plurality of thyristors under the control of a shift register, the current from each capacitor rising in use to a maximum and then falling to substantially zero, current-detecting means being arranged to control the shift register to initiate discharge of each capacitor except the first upon detection of substantially zero current from the preceding capacitor in the sequence.

DESCRIPTION OF THE PREFERRED EMBODIMENTS

Figure 2A:
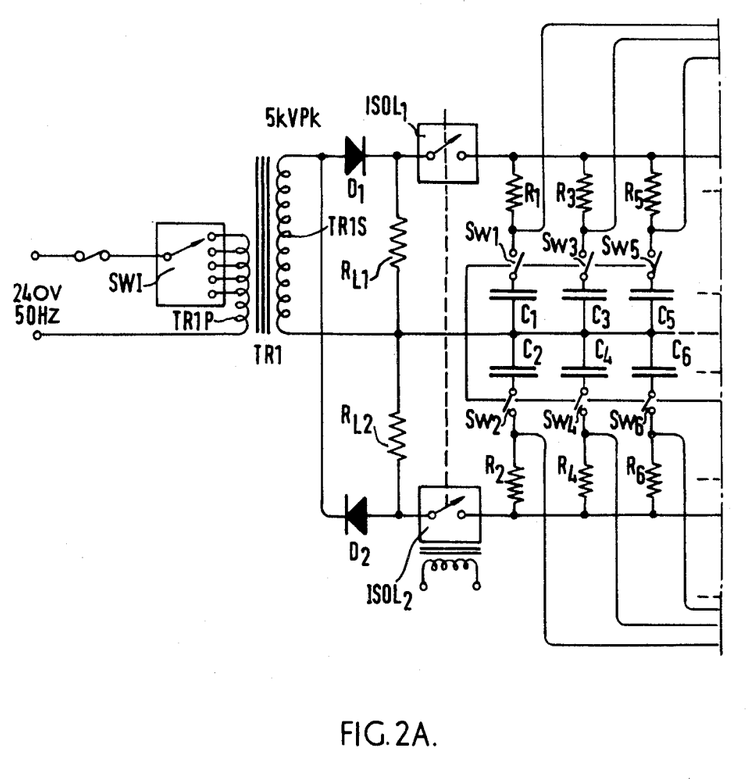
FIG. 2 (formed by FIGS. 2A and 2B side-by-side with FIG. 2A to the left of FIG. 2B,) is a circuit diagram of a first apparatus embodying the invention.
Figure 2B:
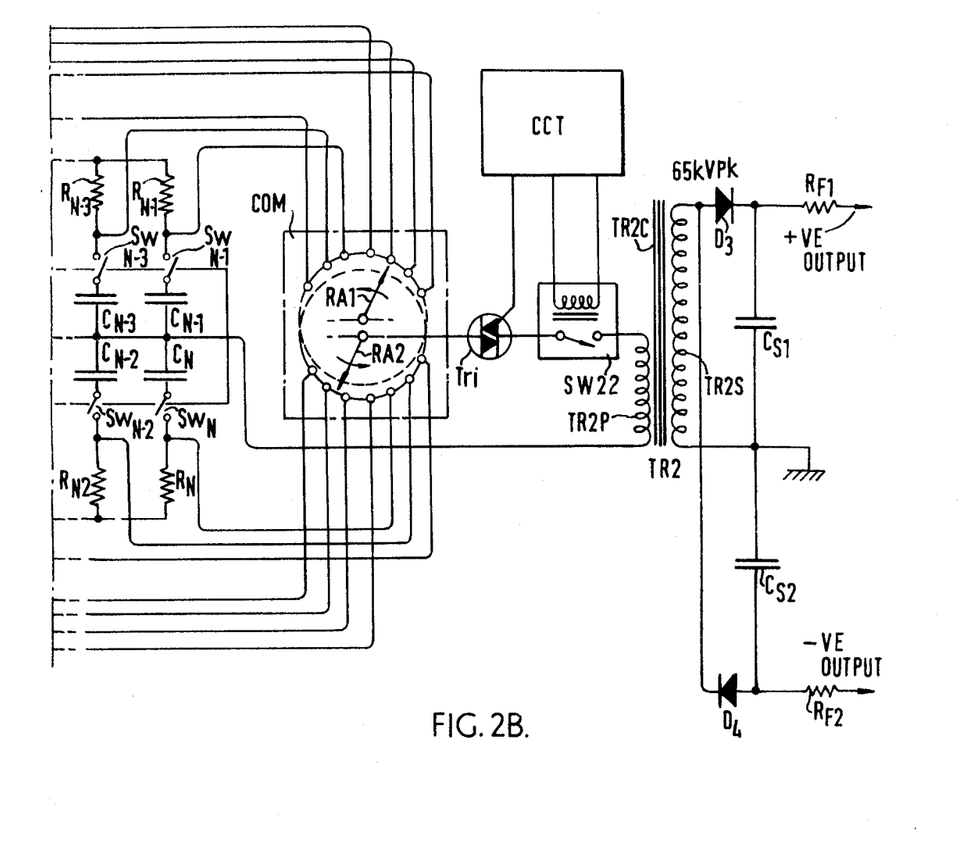

The primary winding TR1P of TR1 is connected via an output voltage-selector switch SWI to 240 volt 50Hz mains and is designed for the secondary winding TR1S of TR1 to produce up to 5kV peak, (i.e. 10kV peak-to-peak). Hence each of capacitors $C_1$ to $C_N$ can be charged slowly up to 5kV, (or less), the upper electrodes of the odd-numbered capacitors positively with respect to the said common connection, the lower electrodes of the even-numbered capacitors negatively with respect to the common connection, provided that their respective on/off switches $Sw_{2n-1}$ and $Sw_{2n}$ are closed. The maximum total stored energy is only $40 \times 100$ joules or 4.0 kilo-joules, i.e. 100 joules per capacitor, (half the product of the capacitance and the square of the voltage).

Figure 3:
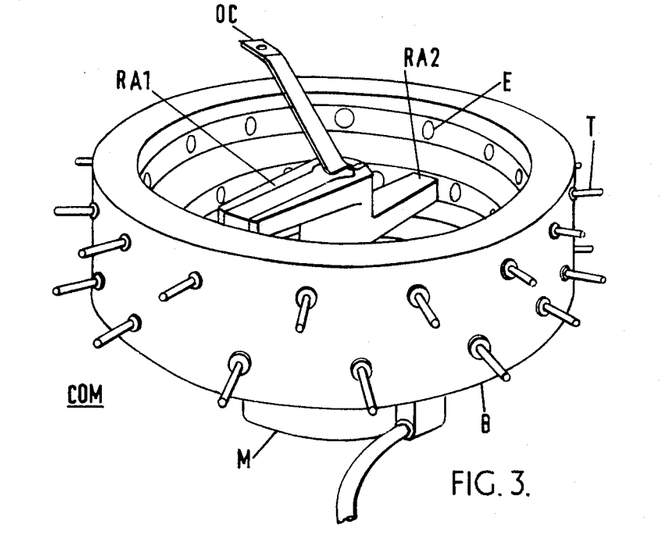
FIG. 3 is a drawing of a commutator in the apparatus of FIG. 2.

The apparatus of FIGS. 2 and 3 also comprises a spark-gap commutator COM. The commutator comprises a stator formed by an insulating body B in which there is an upper ring of 20 spark-gap electrodes $E_{2n-1}$ and a lower ring of 20 spark-gap electrodes $E_{2n}$. Each spark-gap electrode E is connected to a respective one of N (where, in the preferred embodiment, $N=40$) terminals T. Inside the stator is a rotor driven by a motor M. The rotor comprises an upper rotor arm $RA_1$ and a lower rotor arm $RA_2$ co-operable respectively with the upper and lower rings of spark-gap electrodes E. The rotor also comprises an output contact OC connected to both rotor arms. The arrangement is such that, as the rotor rotates, it effectively "connects" the output contact OC alternately to upper and lower spark-gap electrodes, connection to each upper spark-gap electrode being followed, after an interval of total disconnection, by connection to the next lower spark-gap electrode, and vice versa.

The upper electrodes of the twenty odd-numbered capacitors in the embodiment having 40 capacitors are connected to respective terminals $T_1, T_3, \ldots T_{2n-1}, \ldots T_{39}$ of the upper ring of spark-gap electrodes of the commutator, through their respective switches $S_{W2n}$ (wherein n is an integer). The lower electrodes of the twenty even-numbered capacitors are connected to respective terminals $T_2, T_4, \ldots T_{2n}, \ldots T_{40}$ of the lower ring of spark-gap electrodes, through their respective switches $S_{W2n-1}$ (wherein n is an integer). The output contact OC is connected through a triac Tri (which may be replaced in a modification by two back-to-back thyristors or a gas-filled tube) and a relay-operated safety switch SW22 to the upper end of the primary winding TR2P of another voltage step-up transformer TR2. The lower end of the primary winding TR2P of TR2 is connected via the aforesaid common connection directly to the lower end of the secondary winding TR1S of TR1. The safety switch SW22 is relay-operated from a control circuit CCT and is adapted to be selectively closed when a high voltage output pulse is required. Triac Tri is automatically controlled by control circuit CCT, after closure of SW22 to close just before rotor arm RA1 connects to any one of the terminals T or, rather, to the corresponding spark-gap electrode E. Thus closure of switch SW22 followed by automatic closure of Triac Tri results in sequential discharge of some or all of the capacitors $C_1$ to $C_N$ through the primary winding of TR2, up to twenty positive pulses alternating with an equal number of negative pulses (with below-unity duty ratio) to produce AC in the primary winding TR2P of TR2 and an alternating magnetic field in the core TR2C of TR2. Each pulse has a duration of 2ms and there is a gap between successive pulses of 0.5mS. Hence the total time period for one positive pulse followed by one negative pulse is 5mS.

During charging, resistors $R_{2n-1}$ and $R_{2n}$ limit the charging current magnitude to a value within the load capacity of the mains supply and TR1. During discharge, resistors $R_{2n-1}$ and $R_{2n}$ substantially isolate other capacitors from whichever capacitor is being discharged at any instant. Further isolation, if required, may be obtained by forty diodes (not shown) each in series with a respective one of resistors $R_{2n-1}$ and $R_{2n}$, with the diodes poled to pass charge current but not discharge current.

The secondary winding of TR2 produces 65kV peak, that is, 130kV peak-to-peak. The upper end of this winding is connected through rectifying diodes $D_3$ and $D_4$ and flashover protection resistances $R_{F1}$ and $R_{F2}$ to positive and negative output terminals respectively. The lower end of this winding is grounded. Two smoothing capacitors $C_{S1}$ and $C_{S2}$ are connected between ground and the respective junctions, one between $D_3$ and $R_{F1}$ and the other between $D_4$ and $R_{F2}$. Each smoothing capacitor $C_{S1}$, $C_{S2}$, though having to withstand very high voltage, need only have small, e.g. $0.025\mu F$, capacitance.

The speed of the commutator is 10 revolutions per second, to permit discharge of all 40 capacitors $C_1$ to $C_N$ in 100 milliseconds. Since they are of alternate polarity, the fundamental frequency at TR2 is 200Hz. Although each half period of this fundamental frequency at TR2 is thus 2.5mS, the connection of the rotor arm to each spark-gap electrode E lasts for only approximately 2mS, during which time the pulse is required to rise to a maximum and then down to zero, approximately half-sinusoidally. Accordingly the transformer TR2 is designed to have leakage reactance, to form a tuned circuit with each of the ($8\mu F$) capacitors $C_1$ to $C_N$ and $C_{S1}$ or $C_{S2}$ with a natural period of 4mS or natural frequency of 250 Hz. This leakage reactance is approximately 318 mH, referred to the primary winding of TR2. It is believed that as much as 80 to 90% of the total stored energy may be obtainable at the output, at a voltage adequate to produce acceptable quality X-rays from an X-ray tube in a diagnostic unit.

If less energy is required at the output, one or more of switches $S_{W1}$ to $S_{WN}$ may be opened, in such a way that the closed switches are connected to a continuous series of terminals at the commutator.

After capacitors $C_1$ to $C_N$ have been charged up, charge isolators $ISOL_1$ and $ISOL_2$ may be opened and the apparatus then disconnected from the mains. A portable supply (not shown) such as a lead-acid accumulator as used in vehicles may be included, possibly with a trickle charger as well, to drive motor M, control circuit CCT and the relay-operated switches. In this way, a transportable diagnostic X-ray unit incorporating the apparatus could be used some distance away from a mains supply.

After use, it is desirable to close $ISOL_1$ and $ISOL_2$ to discharge $C_1$ to $C_N$ through $R_{L1}$ and $R_{L2}$ with a discharge time of not more than 120 seconds to 50 volts, for the sake of safety.

It will be appreciated that, until SW22 is closed, there is no high voltage at the output, hence no X-ray leakage from an X-ray tube connected to the output.

It will also be appreciated that storage of 4 kilojoules at 5kV is far safer than storage of 8 kilojoules at 130kV.

Forty (40) is not an essential number of chargeable capacitors, but is believed to represent a good compromise number. A charging voltage of 5kV is high enough for a reasonably large charge per unit volume of solid dielectric capacitor and low enough for commutation.

The commutator may be replaced by electronic switch circuitry. Since the commutator is rotary, it is not essential for capacitor $C_1$ to be the first to discharge. The control circuit CCT may be designed for Triac Tri to close in the interval of total disconnection between any pair at all of the spark-gap electrodes $E_1$ to $E_{40}$.

In a modification, switches $S_{W2n-1}$ and $S_{W2n}$ are omitted and the apparatus is modified, either for the control circuit to count pairs of positive and negative pulses and to open Triac Tri after the required number have gone through, or by detecting the angular position of the rotor or by detecting discharge of the capacitors, to control the output duration and hence the output energy. Control logic should ensure equal numbers of positive and negative pulses through TR2, to avoid polarising TR2.

It is conceivable to have more than one primary winding on TR2. For example, the odd-numbered capacitors could discharge into one primary winding and the even numbered capacitors into another primary winding, with polarities such as to produce an alternating magnetic field in the core of TR2 and an alternating output from the secondary winding of TR2.

Possibly, in a modification, three sets of pairs of capacitors could be arranged to discharge through three respective primary windings of a three-phase high voltage step-up transformer to produce a three-phase output. Such an output might need less filtering and perhaps the step-up transformer could be smaller.

It is desirable for the control circuit to be designed to allow for remanent magnetisation of the core of TR2 due to previous operation. More particularly, the control circuit should ensure that the first capacitor to discharge reverses the polarity of the core. This will be so if an even number of capacitors are always discharged and if the same capacitor or polarity of capacitor is always the first to discharge. Otherwise one requires either a memory or a remanent magnetisation sensor. Ways of doing this are known in the high voltage discharge art.

Figure 4A:
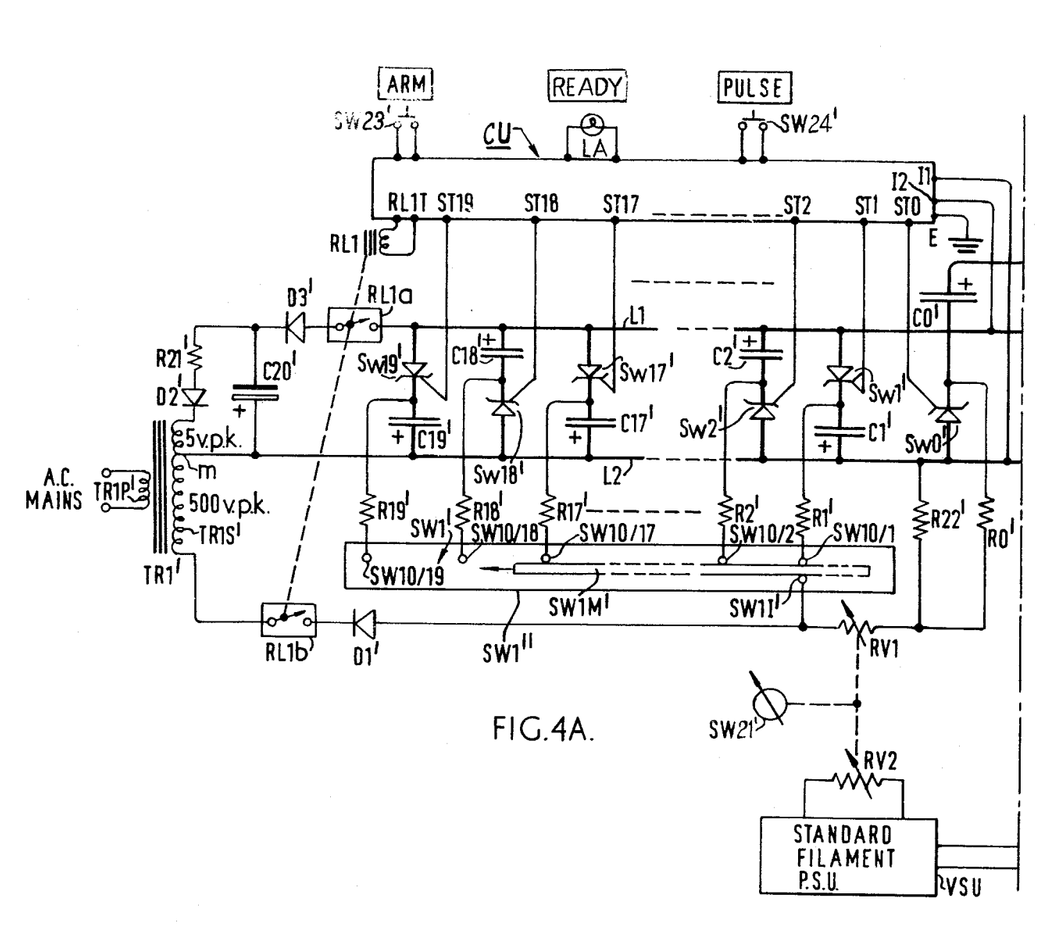
FIG. 4 (formed by FIGS. 4A and 4B side-by-side with FIG. 4A to the left of FIG. 4B) is a circuit diagram of a second apparatus embodying the invention.
Figure 4B:
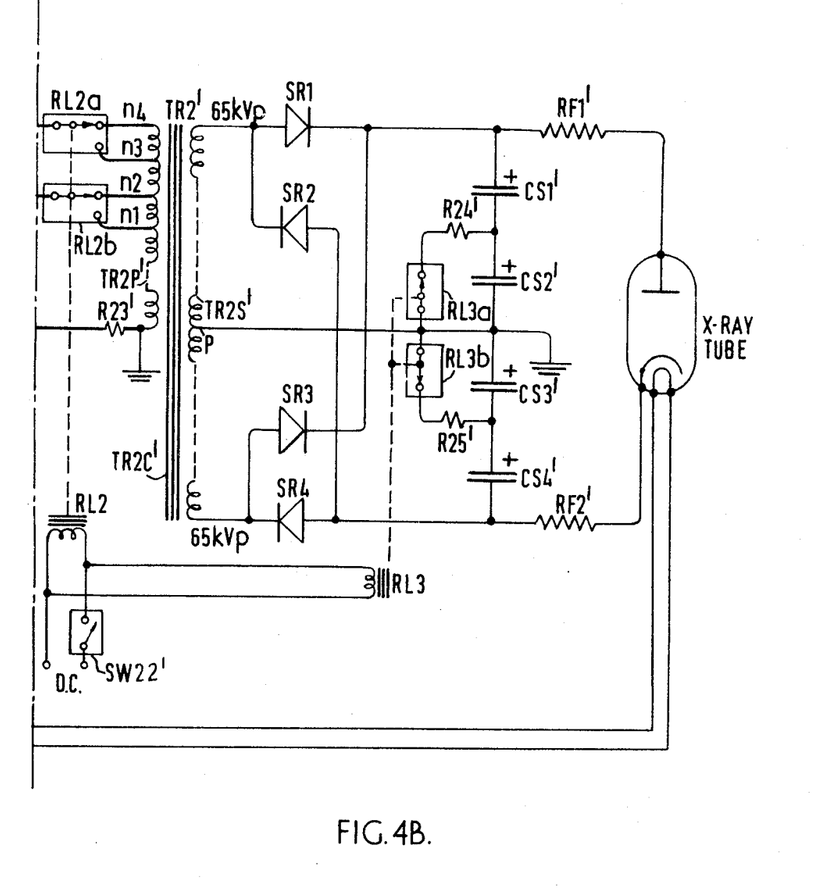
Figure 5:
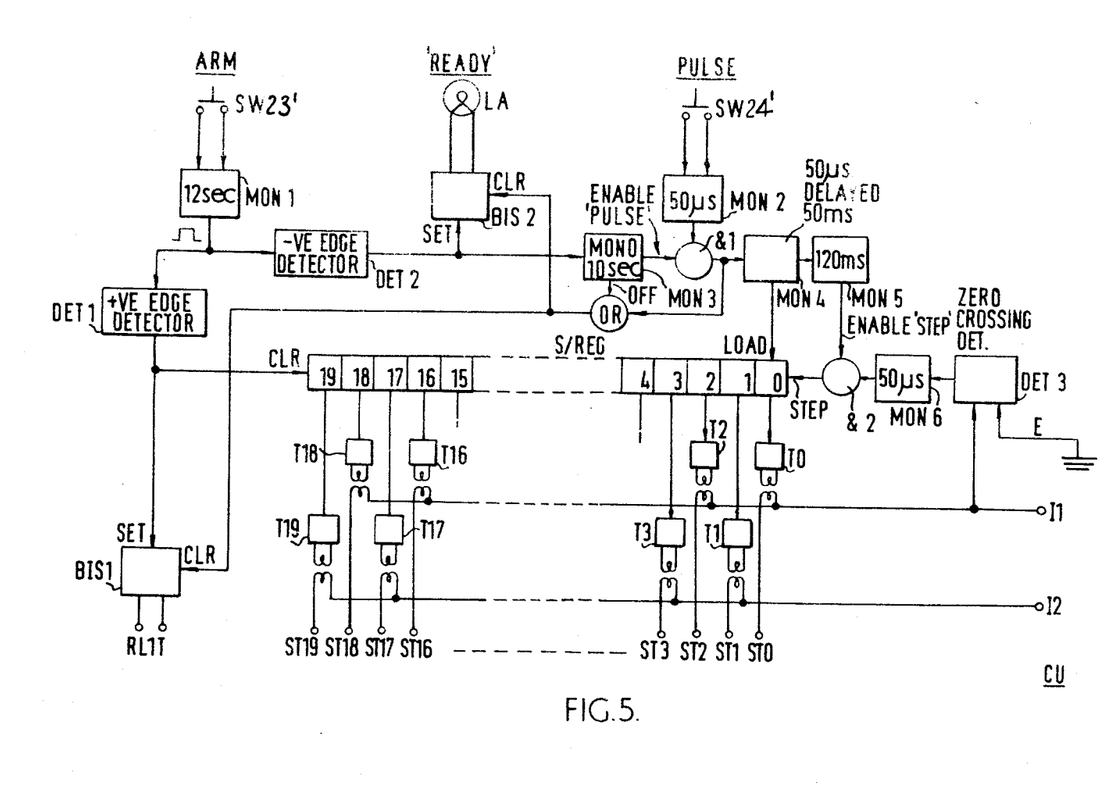
FIG. 5 is a circuit diagram of a control unit in the apparatus of FIG. 4.

The apparatus illustrated in FIGS. 4 and 5 comprises 20 capacitors C0' to C19', of which only capacitors C0', C1', C2', C17', C18' and C19' are shown. Each of capacitors C0' to C19' is connected in series with a respective one of twenty thyristor switches Sw0' to Sw19' between lines L1 and L2. Each of the "odd-numbered" switches and capacitors is connected with the anode of the switch to line L1 and the bottom terminal of the capacitor to line L2, whilst each of the "even-numbered" switches and capacitors is connected with the upper terminal of the capacitor to line L1 and the anode of the thyristor to line L2. The anode of thyristor Sw0' is connected to line L2.

The primary winding TR1P' of a first transformer TR1' is supplied with AC mains, for example, 240 volts at 50 hertz. The secondary winding TR1S' of transformer TR1' has a tapping $m$ connected directly to line L2. The upper end of secondary winding TR1S' is connected through a diode D2', resistor R21', diode D3' and normally open contacts RL1a of a relay RL1 to line L1; a smoothing capacitor C20' is connected between line L2 and the junction of R21' and D3'. The voltage between tapping $m$ and the upper end of secondary winding TR1S' is about five volts peak.

The lower end of secondary winding TR1S' is connected through normally open contacts RL1b of relay RL1 and diode D1' to an input terminal SW1I' of a switch SW1''. The switch SW1'' has 19 output terminals SW10/1 to SW10/19 which are connected through respective resistors R1' to R19' to the junctions between the nineteen capacitors C1' to C19' and their respective thyristor switches Sw0' to Sw19'. Switch Sw1'' has a moving contact SW1M' which is selectively operable to connect the input terminal SW1I' either to all of output terminals SW10/1 to SW10/19 or to a lesser number of the said output terminals forming a continuous series from SW10/1 upwards. Hence, when the time comes to discharge the selected number of capacitors, in a manner described hereinafter, either all twenty capacitors C0' to C19' are discharged or a lesser number, such lesser number forming a continuous series from C0' upwards.

The lower end of secondary winding TR1S' is also connected through contacts RL1b and D1' through a selectively variable resistor RV1 and a resistance R0' to the junction between capacitor C0' and thyristor Sw0'. The voltage between tapping $m$ and the lower end of secondary winding TR1S' is about 500 volts peak.

A second transformer TR2' has a primary winding TR2P' of which the lower end is grounded and is connected through a resistor R23' to line L2. The primary winding TR2P' has three tappings $n1$, $n2$ and $n3$ and an end terminal $n4$, as shown. A relay RL2 has changeover contacts RL2a and RL2b arranged as shown, for selective connection of line L1 and the upper terminal of capacitor C0' respectively either to terminals $n2$ and $n4$ or to terminals $n1$ and $n3$. It will be apparent that connection to terminals $n1$ and $n3$ produces a higher voltage step-up ratio for transformer TR2' than connection to terminals $n2$ and $n4$.

A control unit CU has output terminals RL1T for energising relay RL1, output terminals ST0 and ST1 to ST19 for firing thyristors Sw0' and Sw1' to Sw19' respectively, reference (ground) input E, reference inputs I1 and I2, control switches SW23' and SW24' and a "ready" indicator lamp LA.

The secondary winding TR2S' of transformer TR2' has a centre tapping P and supplies 65 kilovolts peak between the centre tapping P and each end of the secondary winding, so that there is a total of about 130 kilovolts peak across the whole secondary winding TR2S'. Full-wave rectification and smoothing is provided by four rectifiers SR1 to SR4 and four smoothing capacitors CS1' to CS4', connected as shown, with the centre tapping $p$ grounded. Each smoothing capacitor CS1' to CS4', though having to withstand very high voltage, need only have small capacitance. The full-wave, rectified voltage between the junction of SR1 and SR3 and the junction of SR2 and SR4 is applied through flashover protection resistances RF1' and RF2' across the anode and cathode of an X-ray tube as shown. The cathode heating filament of the X-ray tube is connected to a heating voltage supply unit VSU having a selectively variable resistance RV2 for controlling the heating current. The variable resistors RV1 and RV2 are ganged together and controlled by a switch SW21' for controlling the operating voltage of the X-ray tube by controlling the current of the X-ray tube. A relay RL3 has contacts RL3a and RL3b connected as shown through resistors R24' and R25' between tapping $p$ and the junctions of CS1' to CS2' and CS3' to CS4', for selectively shorting out smoothing capacitors CS2' and CS3'. Relays RL2 and RL3 are controlled in parallel by a switch SW22' for selecting either a "high"

voltage range (approximately 92 to 130 kilovolts) or a "low" voltage range (approximately 65 to 92 kilovolts) for the X-ray tube. With the contacts RL2a and RL2b making the aforesaid connections to terminals n2 and n4 as shown, for a low voltage step-up ratio of transformer TR2', the contacts RL3a and RL3b short out capacitors CS2' and CS3'.

Referring now to FIG. 5, the control unit CU comprises a shift register S/REG having 20 output stages 0 to 19 connected respectively to the primaries of 20 output transformers T0 to T19, whose secondaries are connected respectively to the aforementioned terminals ST0 to ST19, for controlling thyristor switches Sw0' to Sw19'. One end of the secondary of each "even-numbered" transformer T0, T2, . . . T18 is connected to reference potential terminal I1, that is to say, to line L2 (FIG. 4A) whilst one end of the secondary winding of each "odd-numbered" transformer T1, T3, . . . T19 is connected to reference terminal I2, that is to say, to line L1 (FIG. 4A). This is to ensure that the signal at each of output terminals ST0 to ST19 is at the right level to fire the respective one of thyristors Sw0' to Sw19' when required.

The control unit CU comprises six monostable devices MON1 to MON6. MON1 produces a twelve second positive-going pulse upon operation of switch SW23', for the purpose of charging up capacitors C0' to C19' in a manner which will be described. The positive-going edge of the pulse from MON1 is detected by a first detector DET1, to "set" a first bistable BIS1, to energise relay RL1 from terminals RL1T. The negative-going edge of the pulse from MON1, twelve seconds later, is detected by a second detector DET2 to "set" a second bistable BIS2 in order to energise the "ready" lamp LA. The detector DET2 also energises monostable MON3 which produces a ten second pulse to enable an "AND" gate "&1" and inhibits an "or" gate "OR" for 10 seconds. During the 10 seconds that the AND gate "&1" is enabled, the switch SW24' may be operated to produce a 50 microsecond pulse from MON2 into gate "&1" and thence into MON4, as well as into the inhibited gate OR. MON4 produces a 50 microsecond pulse after a delay of 50 milliseconds. This pulse from MON4 is applied to MON5 and also to the initial stage "0" of shift register S/REG. The input to stage "0" of S/REG causes energisation of transformer T0 and hence firing of thyristor Sw0', to discharge capacitor C0'. The input to MON5 causes MON5 to produce a pulse of one hundred and twenty milliseconds to enable a second "AND" gate "&2". A zero current detector DET3 is connected between terminals E and I1 to detect the point in time at which the current from each of the capacitors C0' to C19' passes through zero, to operate MON6 which produces a 50 microsecond pulse through AND gate "&2" into shift register S/REG, to step the register on by one step, so that each of transformers T1 to T19 produces an output signal only after the current from the capacitor (C0', . . . C19') associated with the preceding stage has fallen to zero. This enables a high proportion of the energy stored in each of capacitors C0' to C19' to be utilised in the X-ray tube. The discharge circuitry which is "seen" by each of capacitors C0' to C19' in turn is very under-damped, that is to say, highly oscillatory, so that the current from each of capacitors C0' to C19' passes through zero.

In the quiescent state, the relay RL1 is de-energised, disconnecting all power from the capacitors C0' to C19'. Capacitor C20' is charged to a low voltage through R21' and D2'. The operator selects the desired X-ray tube voltage (via the tube filament voltage and hence the maximum tube anode current) by operating switch SW21' to set variable resistors RV1 and RV2. He also sets the desired milliamp-seconds (that is, duration) by setting switch SW1". Selection of the X-ray tube current inherently results in selection of peak tube kilovolts to match the peak power rating of the X-ray tube, due to the natural output impedance characteristics of the apparatus of FIGS. 4A and 4B.

Either the low voltage range or the high voltage range is selected by operating switch SW22'.

To charge the apparatus, switch SW23' is operated, to energise relay RL1 from terminals RL1T. Closure of contacts RL1b connects the secondary winding TR1S' to those of capacitors C0' to C19' selected through switch SW1", charging them up through the associated (high resistance) resistors R0' to R19'. The current return path for the even-numbered capacitors C0', C2', . . . C18' is through terminal n1 or n2, the associated part of primary winding TR2P' and resistor R23' to tapping m on secondary winding TR1S'. The "start-up" capacitor C0' is charged to a voltage equal to, or less than, that on the remaining capacitors, according to the setting of resistor RV1, which forms a potential divider in combination with resistor R22'.

Closure of contacts RL1a causes the capacitor C20' to apply a small, slowly decaying, voltage across the primary winding TR2P', producing an initial flux build-up in the core TR2C' of transformer TR2' opposite in sense to that to be produced by discharge of the start-up capacitor C0'.

After approximately twelve seconds, timed by monostable MON1, the "ready" lamp LA is lit, indicating that the apparatus is ready for operation of switch SW24' by the operator. The monostable MON3 ensures that operation of switch SW24' is only effective if operated within 10 seconds or so of the lamp LA lighting up. For safety reasons, if the operator does not operate switch SW24' during the 10 second period timed by MON3, the trailing edge of the 10 second pulse from MON3 clears bistables BIS1 and BIS2 to release relay RL1 and to turn off the lamp LA.

When the operator operates switch SW24' (within ten seconds of lamp LA lighting up, that is, while MON3 is enabling gate "&1") relay RL1 is released by the signal from MON2 through "&1" to the OR gate to BIS1. This opens contacts RL1a and RL1b to disconnect secondary winding TR1S' from capacitors C0' to C19'. The delay of 50 milliseconds in MON4 is designed to allow time for relay RL1 to release before firing thyristor Sw0' through stage "0" of S/REG and transformer T0. Capacitor C0' discharges into the appropriate "start-up" terminal n3 or n4 of primary winding TR2P'. The values of C0', the "start-up" turns ratio (relative to n3 or n4) of TR2', the leakage inductances of TR2' and the X-ray tube current, are such that the full required peak output voltage is just attained across capacitors CS1' to CS4', or CS1' and CS4', towards the end of the discharge of C0'. The current through primary winding TR2P' falls back to zero soon after the peak output voltage is passed, and thyristor Sw0' turns off. Detector DET3 detects the zero current by the voltage between E and I1 and applies a signal to MON6, which applies a pulse through "&2" to the register S/REG to advance the register by one step, firing the next thyristor Sw1', to discharge capacitor C1' into the appropriate "run" tapping n1 or n2 of the primary winding TR2P', reversing the flux in the core TR2C'. The values of each of capacitors C0' to C19', the "run" turns ratio of TR2' (relative to $n1$ or $n2$) the leakage inductances of TR2' and the X-ray tube current, likewise are such that the output voltage across smoothing capacitors CS1 to CS4 (or CS1 and CS4) is just raised back to the desired peak value before starting to fall off again. The rectifiers SR1 to SR4, which are silicon rectifiers, ensure that the output voltage is always in the same polarity regardless of the direction of discharge currents in the primary winding TR2P'.

After the current from capacitor C1' has fallen to zero, detector DET3 again causes a stepping pulse to be applied by MON6 through &2 to S/REG, to energise T2 and hence fire SW2', to discharge C2' into TR2P'. Likewise, when C2' has become completely discharged, C3' is discharged, and so forth, right up to C19' or before, depending upon the setting of SW1". At the end of this process, which lasts a maximum time of approximately 100 milliseconds, (for all of capacitors C0' to C19' operative) the smoothing capacitors CS1 to CS4 (or CS1 and CS4) discharge through the X-ray tube until there is negligible energy stored anywhere in the apparatus, terminating the voltage across the X-ray tube and bringing the apparatus back to the quiescent state.

The following table gives some component values for the apparatus of FIGS. 2 and 4:

| | | | |
|---|---|---|---|
| R0' | = 3300Ω | C0' | = 2600μF 500v.d.c. |
| R1' to R19' | = 5000Ω | C1' to C19' | = 1550μF 500v.d.c. |
| R21' | = 100Ω | C20' | = 20,000 μF 5v. |
| R22' | = 470Ω | | |
| R23' | = 3mΩ | CS1, CS4 | = 88nF 46kV d.c. |
| R24' | = 330Ω | CS3, CS4 | = 88nF 33kV d.c. |
| R25' | = 330Ω | | |
| RV1 | = 68Ω lin. | Transformer TR2' | |
| | | Turns ratios: | |
| RV2, RF1, RF2 are standard | | $n_1$ = 1:487 | |
| components of conventional | | $n_2$ = 1:344 | |
| PSU's. | | $n_3$ = 1:299 | |
| | | $n_4$ = 1:211 | |
| | | Leakage inductance: | |
| | | 1.78mH referred to primary | |
| | | TR2P' for | |
| | | all primary tappings. | |

I claim:

1. Apparatus for generating a high voltage output signal having a limited duration, said apparatus comprising:
   a network of capacitors including a plurality of capacitors;
   charging means for charging each of said capacitors to a predetermined value;
   a voltage step-up transformer having at least one primary winding, a core, and at least one secondary winding;
   switch means for serially discharging a predetermined number of said capacitors through said at least one primary winding so as to generate a high voltage output signal in said at least one secondary winding, said switch means controlling the duration of said high voltage output signal by controlling the length of time during which said network of capacitors discharges through said at least one primary winding, said switch means discharging said network of capacitors at a rate which is independent of the rate at which said charging means charges said network of capacitors;
   means for disconnecting said charging means from said network of capacitors prior to the instant at which said switch means begins discharging said predetermined number of capacitors.

2. The apparatus of claim 1 wherein the length of time said capacitive network discharges through said at least one primary winding is proportional to number of said capacitors which are discharged by said switch means.

3. The apparatus of claim 2 further including rectifier means for rectifying said high voltage output signal.

4. An apparatus as claimed in claim 3 and further comprising filter means coupled to said rectifier means to smooth the output from the apparatus.

5. An apparatus as claimed in claim 4 wherein the filter means comprises at least one smoothing capacitor.

6. An apparatus as claimed in claim 2 wherein said switch means includes selectively operable means to control the number of said capacitors discharged and thereby to control the time duration of said output signal.

7. The apparatus of claim 1 wherein said network of capacitors comprises first and second sets of $n$ capacitors, $n$ being an integer greater than 1, and wherein said charging means charges said first set of $n$ capacitors with a positive charge relative to a common voltage and charges said second set of $n$ capacitors with a negative charge relative to said common voltage.

8. The apparatus of claim 7 wherein one terminal of each capacitor in said first and second sets of capacitors is connected in common and wherein the remaining terminal of each of said capacitors in said first set of capacitors is supplied with a positive charge and the remaining terminals of each of said capacitors in said second set of capacitors is supplied with a negative charge.

9. An apparatus as claimed in claim 1 and further comprising means for selectively varying the voltage step-up ratio of said voltage step-up transformer.

10. An apparatus as claimed in claim 9 wherein the voltage step-up ratio of the voltage step-up transformer is selectively variable by variation of the number of primary winding turns through which each of said plurality of capacitors is discharged.

11. An apparatus as claimed in claim 1 further comprising an additional capacitor and means connecting said additional capacitor to said primary winding to cause said additional capacitor to impress a relatively low slowly decaying voltage across said primary winding of the voltage step-up transformer to produce an initial flux in the core opposite in polarity to that to be produced by the discharge of the first one of said plurality of capacitors in the sequence.

12. An apparatus as claimed in claim 1 further comprising means for pre-selecting one of said plurality of capacitors to always be the first to discharge in the sequence, wherein the first capacitor to discharge in the sequence of said plurality of capacitors has a different capacitance to that of each of at least a last group of said capacitors to discharge.

13. An apparatus as claimed in claim 12 wherein the capacitance of said first capacitor is less than that of each of said last group of capacitors.

14. An apparatus as claimed in claim 1 further comprising means for pre-selecting one of said plurality of capacitors to always be the first to discharge in the sequence, wherein the first capacitor to discharge in the sequence of said plurality of capacitors is arranged to discharge into a different number of primary winding turns than each of at least a last group of said capacitors to discharge.

15. An apparatus as claimed in claim 14 wherein the said different number of primary winding turns is a greater number than the number of primary winding turns that said at least a last group of capacitors is to discharge into.

16. The apparatus of claim 1 wherein said switch means comprises:
- a plurality of thyristors, each of said thyristors adapted to selectively discharge a different one of said capacitors;
- a shift register means for serially enabling each thyristor associated with one of said predetermined number of capacitors such that each of said predetermined number of capacitors is serially discharged;
- means for causing said shift register means to enable the thyristor associated with the next capacitor to be serially discharged after the capacitor associated with the thyristor last enabled if fully discharged.

17. The apparatus of claim 1 further including selectively actuatable means for causing said switch means to begin discharging said predetermined number of capacitors in response to the selective actuation thereof and further including means for preventing said selectively actuatable means from causing said switch means to begin discharging said predetermined number of capacitors if said selectively actuatable means is not actuated within a predetermined time period after said charging means charges said capacitors.

18. An apparatus for generating high voltage pulses by capacitor discharge, comprising a plurality of capacitors, means for charging up each capacitor, a voltage step-up transformer having at least one primary winding, a core and at least one secondary winding, switching means selectively operable to at least partly discharge the capacitors sequentially through said at least one primary winding in such a manner as to induce an alternating magnetic field in the core and a high alternating voltage in said at least one secondary winding, and rectifier means to rectify the high alternating voltage from the secondary winding; filter means, comprising at least one smoothing capacitor, to smooth the output from the apparatus; selectively operable means to control the number of capacitors discharged and hence to control the total energy of the output; means for selectively varying the voltage step-up ratio of the voltage step-up transformer by variation of the number of turns of the primary winding through which each of said plurality of capacitors is discharged; a further capacitor and means connecting said further capacitor to said primary winding to cause said further capacitor to impress a relatively low slowly decaying voltage across said at least one primary winding of the voltage step-up transformer to produce an initial flux in the core opposite in polarity to that to be produced by the discharge of the first one of said plurality of capacitors in the sequence; and means for pre-selecting one of said plurality of capacitors to always be the first to discharge in the sequence, wherein the first capacitor to discharge in the sequence of said plurality of capacitors has a different capacitance to that of each of at least a last group of said capacitors to discharge; wherein the first capacitor to discharge in the sequence of said plurality of capacitors is arranged to discharge into a different number of primary winding turns than each of at least the last group of said capacitors to discharge.

* * * * *